United States Patent
Lin et al.

(10) Patent No.: US 11,106,985 B1
(45) Date of Patent: Aug. 31, 2021

(54) POWER DEVICE WITH SELF-HEALTH STATUS PREDICTION FUNCTION AND SELF-HEALTH STATUS PREDICTION METHOD THEREOF AND CLOUD SERVER SUITABLE FOR A PLURALITY OF POWER DEVICES

(71) Applicant: CYBER POWER SYSTEMS, INC., Taipei (TW)

(72) Inventors: Yung-Hsiang Lin, Taipei (TW); Chia-Min Yeh, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 0 days.

(21) Appl. No.: 16/902,753

(22) Filed: Jun. 16, 2020

(30) Foreign Application Priority Data

Feb. 19, 2020 (CN) .......................... 202010101505.2

(51) Int. Cl.
*G06N 5/04* (2006.01)
*G06N 20/00* (2019.01)
*G01R 31/40* (2020.01)
*G08B 7/06* (2006.01)
*G08B 21/18* (2006.01)
*H04L 12/18* (2006.01)
(Continued)

(52) U.S. Cl.
CPC ............... *G06N 5/04* (2013.01); *G01R 31/40* (2013.01); *G06N 20/00* (2019.01); *G08B 7/06* (2013.01); *G08B 21/185* (2013.01); *H04L 12/1895* (2013.01); *G06F 1/28* (2013.01); *H04L 67/10* (2013.01)

(58) Field of Classification Search
CPC .......... G06N 5/04; G06N 20/00; G01R 31/40; G08B 7/06; G08B 21/185; H04L 12/1895; H04L 67/10; G06F 1/28
See application file for complete search history.

(56) References Cited

U.S. PATENT DOCUMENTS

| 10,984,154 B2* | 4/2021 | Wang ....................... H02S 50/00 |
| 2008/0262820 A1* | 10/2008 | Nasle ................. G06Q 30/0206 |
| | | 703/18 |

(Continued)

FOREIGN PATENT DOCUMENTS

TW    I669617 B    8/2019

*Primary Examiner* — Joseph H Feild
*Assistant Examiner* — Rufus C Point
(74) *Attorney, Agent, or Firm* — Bacon & Thomas, PLLC

(57) ABSTRACT

A power device with self-health status prediction function and a self-health status prediction method thereof and a cloud server suitable for a plurality of power devices are provided. The power device is configured to obtain a health index prediction model and a health prediction index threshold of the power device from the cloud server through a communication module thereof, and is configured to put a plurality of obtained sensing data and basic information of the power device into the health index prediction model to obtain a health prediction index. The power device is also configured to obtain a health status prediction data of the power device according to a comparison result between the health prediction index and the health prediction index threshold, so as to perform a follow-up process. Wherein the health index prediction model is constructed and trained by the cloud server by way of machine learning.

8 Claims, 5 Drawing Sheets

(51) Int. Cl.
*H04L 29/08* (2006.01)
*G06F 1/28* (2006.01)

(56) References Cited

U.S. PATENT DOCUMENTS

| | | | |
|---|---|---|---|
| 2009/0113049 A1* | 4/2009 | Nasle | G05B 19/0428 709/224 |
| 2016/0247065 A1* | 8/2016 | Nasle | G06N 20/00 |
| 2019/0372928 A1* | 12/2019 | Chien | H04L 61/2015 |
| 2020/0162354 A1* | 5/2020 | Drees | H04L 41/0645 |

* cited by examiner

POWER DEVICE WITH SELF-HEALTH STATUS PREDICTION FUNCTION AND SELF-HEALTH STATUS PREDICTION METHOD THEREOF AND CLOUD SERVER SUITABLE FOR A PLURALITY OF POWER DEVICES

BACKGROUND OF THE INVENTION

Field of the Invention

The present invention relates to the technical field of power supply; and more particularly, to a power device with self-health status prediction function and a self-health status prediction method thereof, and a cloud server suitable for a plurality of power devices.

Description of Related Art

A power device, such as an uninterruptible power system (UPS), a power distribution unit (PDU), or an auto transfer switch (ATS), is used to supply operation power to at least one load so that these loads can operate normally.

However, once a power device fails (for example, due to damage to its internal parts), it is likely that the power device will not be able to supply power to the load normally, and then these loads will not operate normally. At this time, if an important load (such as critical medical equipment) fails to operate normally, the consequences caused by it are hard to imagine. Therefore, if the health status of the power device can be predicted so that the maintenance personnel can take preventive measures first when the power device is in poor health condition, the aforementioned problems can be effectively prevented.

SUMMARY OF THE INVENTION

An object of the present invention is to provide a power device with self-health status prediction function.

Another object of the present invention is to provide a self-health status prediction method of a power device.

Still another object of the present invention is to provide a cloud server suitable for a plurality of power devices.

To achieve the above object, the present invention provides a power device with self-health status prediction function, which comprises a plurality of sensors, a communication module, a control unit and a memory unit. The sensors are configured for obtaining a plurality of sensing data. The control unit is configured for obtaining a health index prediction model and a health prediction index threshold of the power device from a cloud server through the communication module, putting the obtained sensing data and basic information of the power device into the health index prediction model for calculation to obtain a health prediction index, and obtaining a health status prediction data of the power device according to a comparison result between the health prediction index and the health prediction index threshold, so as to perform a follow-up process, wherein the health index prediction model is constructed and trained by the cloud server by way of machine learning. As for the memory unit, it is configured for storing the basic information of the power device, the health index prediction model and the health prediction index threshold.

To achieve the above another object, the present invention provides a self-health status prediction method of a power device, wherein the power device comprises a plurality of sensors and a communication module. The method comprises the following steps: obtaining a health index prediction model and a health prediction index threshold of the power device from a cloud server through the communication module, wherein the health index prediction model is constructed and trained by the cloud server by way of machine learning; obtaining a plurality of sensing data by the sensors; putting the obtained sensing data and basic information of the power device into the health index prediction model for calculation to obtain a health prediction index; and obtaining a health status prediction data of the power device according to a comparison result between the health prediction index and the health prediction index threshold, so as to perform a follow-up process.

To achieve the above still another object, the present invention provides a cloud server suitable for a plurality of power devices. The cloud server comprises a communication module, a database, a prediction-model training module, and a data collection module. The database is configured for storing basic information, sensing data, health status prediction data, abnormal event data, lifetime data and maintenance data of each power device, and for storing a health prediction index threshold corresponding to a model name of each power device. The prediction-model training module is configured for constructing and training a health index prediction model for each model name, wherein each health index prediction model is constructed and trained, by way of machine learning, based on the basic information, the sensing data, the health status prediction data, the abnormal event data, the lifetime data and the maintenance data of the power devices with a corresponding model name in the database. As for the data collection module, it is configured for collecting basic information, sensing data, health status prediction data, and abnormal event data of each power device through the communication module, obtaining lifetime data of each power device based on corresponding basic information, providing a web-based user interface for collecting maintenance data of each power device and the health prediction index thresholds, and storing all of the collected data, the health prediction index thresholds, and all of the obtained lifetime data to the database.

In order to make the above objects, technical features and gains after actual implementation more obvious and easy to understand, in the following, the preferred embodiments will be described with reference to the corresponding drawings and will be described in more detail.

BRIEF DESCRIPTION OF THE DRAWINGS

Other features and advantages of the present invention will become apparent in the following detailed description of the preferred embodiments with reference to the accompanying drawings, of which.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 1:
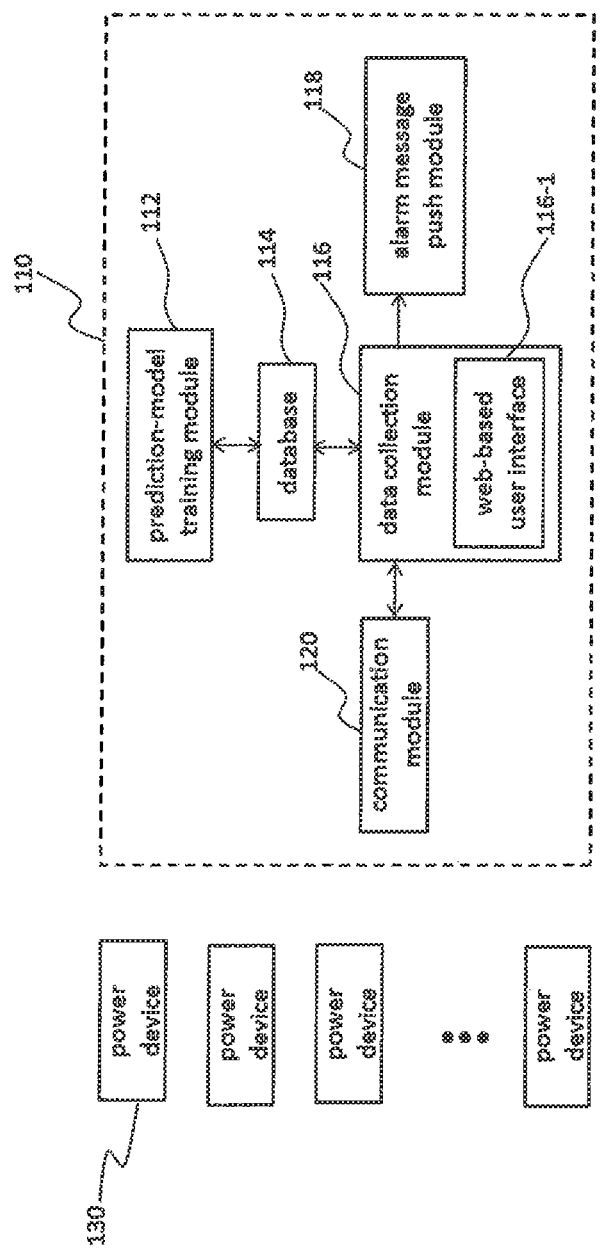
FIG. 1 shows a plurality of power devices according to an embodiment of the present invention and a cloud server according to an embodiment of the present invention.
Figure 2:
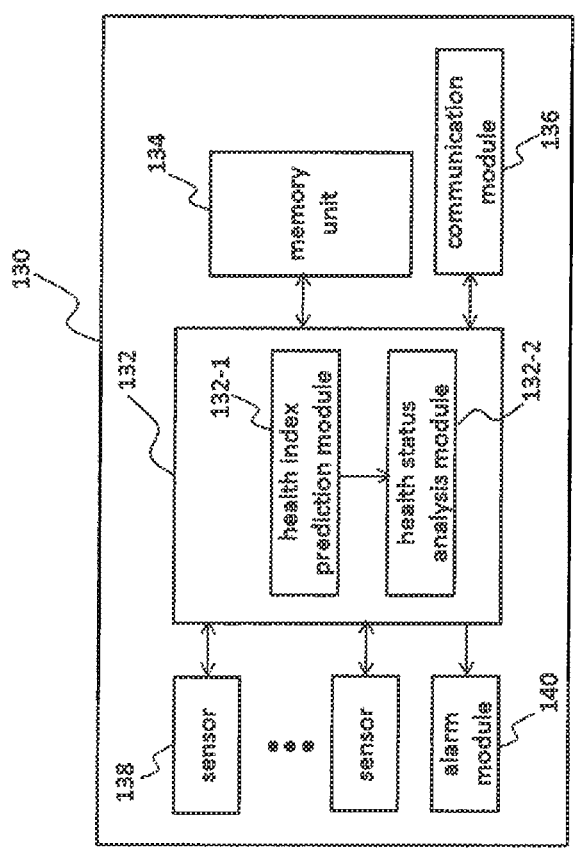
FIG. 2 shows the internal architecture of each power device of FIG. 1.

FIG. 1 shows a plurality of power devices according to an embodiment of the present invention and a cloud server according to an embodiment of the present invention, and FIG. 2 shows the internal architecture of each power device of FIG. 1. Referring to FIG. 1 and FIG. 2, in this embodiment the cloud server 110 comprises a prediction-model training module 112, a database 114, a data collection module 116, an alarm message push module 118, and a communication module 120. Each power device 130 comprises a control unit 132, a memory unit 134, a communication module 136, a plurality of sensors 138, and an alarm module 140, For the convenience of description, the following description is based on the example that the power devices 130 are uninterruptible power systems. The power devices 130 can be on-line UPS's, off-line UPSs or line-interactive UPSs, or even consists of at least two of the three types of uninterruptible power systems described above. In addition, FIG. 2 only illustrates the relevant part of each power device 130 in order to focus on the technical content of the present invention.

First of all, the operation of the power device 130 will be described. Referring to FIG. 2, the control unit 132 of the power device 130 is configured to obtain a plurality of sensing data through the sensors 138. The operation for obtaining the sensing data may be performed in a regular manner or an irregular manner. The obtained sensing data comprises at least one of an input voltage, an input current, an output voltage, an output current, a battery voltage, a battery charging current, a battery discharge current, an ambient temperature and an ambient humidity of the power device 130. After obtaining these sensing data, the control unit 132 determines whether an abnormal event (e.g., low input voltage, low battery voltage, high battery internal resistance, and high ambient temperature) occurs, so as to obtain abnormal event data and store the obtained sensing data and the obtained abnormal event data to the memory unit 134. The memory unit 134 further stores basic information of the power device 130. The said basic information comprises at least one of a model name, a manufacturing date, a rated power, a rated voltage and a rated current of the power device 130.

The control unit 132 is further configured for obtaining a health index prediction model and a health prediction index threshold of the power device 130 from the cloud server 110 through the communication module 136, and for storing the health index prediction model and the health prediction index threshold to the memory unit 134, wherein the health index prediction model is constructed and trained by the cloud server 110 by way of machine learning (described later in detail). After obtaining the health index prediction model and the health prediction index threshold, the control unit 132 puts the obtained sensing data and the basic information of the power device 130 into the health index prediction model for calculation to obtain a health prediction index (e.g., the probability that the power device 130 will fail in a predetermined time), obtains a health status prediction data of the power device 130 according to a comparison result between the health prediction index and the health prediction index threshold, and stores the health status prediction data to the memory unit 134.

In this embodiment, the control unit 132 comprises a health index prediction module 132-1 and a health status analysis module 132-2. The health index prediction module 132-1 is configured for putting the obtained sensing data and the basic information of the power device 130 into the health index prediction model for calculation to obtain the health prediction index. The health status analysis module 132-2 is configured for comparing the health prediction index with the health prediction index threshold to obtain the health statue prediction data.

After obtaining the health status prediction data of the power device 130, the control unit 132 performs a follow-up process accordingly. For example, when the health status prediction data indicates that the power device 130 is in poor health condition, the follow-up process may comprises at least one of notifying, through the communication module 136, a mail server (not shown) to send an alert letter; notifying, through the communication module 136, an alarm messenger (not shown) to send an alarm short message; and controlling the alarm module 140 to issue an alarm, Therefore, the maintenance personnel can take preventive measures first, such as replacing damaged parts. Certainly no matter what health status of the power device 130 indicated by the health status prediction data is, the follow-up process may further comprise transmitting the health status prediction data to the cloud server 110 through the communication module 136, so that the cloud server 110 performs a corresponding process according to the health status of the power device 130 indicated by the health status prediction data (described later in detail).

In addition, in this embodiment the alarm module 140 comprises at least one of a display device (not shown) and an audible alarm device (not shown), so as to issue corresponding alarm messages according to actual needs. Furthermore, in this embodiment the control unit 132 is further configured for obtaining an alarm execution script from the cloud server 110 through the communication module 136. The alarm execution script has an alarm action and at least one determination condition which are set by a user. The determination conditions comprise, for example, whether the battery voltage is lower than a first predetermined value, and whether the output voltage of the power device 130 is lower than a second predetermined value. When the control unit 132 determines that the determination conditions in the alarm execution script are satisfied, the control unit 132 controls the alarm module 140 to execute the alarm action. The alarm action comprises, for example, controlling the display device of the alarm module 140 to emit a red flashing light, controlling the audible alarm device of the alarm module 140 to emit a series of alarm sounds, or performing the above two alarm modes simultaneously.

Next, the operation of the cloud server 110 will be described. Referring to FIG. 1 again, in this embodiment the database 114 of the cloud server 110 is configured for storing basic information, sensing data, health status prediction data, abnormal event data, lifetime data and maintenance data of each power device 130, and for storing a health prediction index threshold corresponding to a model name of each power device 130. For example, when the power devices 130 shown in FIG. 1 have two different model names in total, the database 114 stores two different health prediction index thresholds corresponding to the two model names.

The prediction-model training module 112 is configured for constructing and training a health index prediction model for each model name, wherein each health index prediction model is constructed and trained, by way of machine learning, based on the basic information, the sensing data, the health status prediction data, the abnormal event data, the lifetime data and the maintenance data of the power devices 130 with a corresponding model name in the database 114. In this embodiment, the machine learning algorithms used by the cloud server 110 comprise at least one of Artificial neural network algorithm, Decision tree algorithm, K-means algorithm, Support vector machine algorithm, Linear regression algorithm, and Logistic regression algorithm.

The data collection module 116 is configured for collecting basic information, sensing data, health status prediction data, and abnormal event data of each power device 130 through the communication module 120, and is configured for obtaining lifetime data of each power device 130 based on corresponding basic information. In addition, the data collection module 116 is further configured for providing a web-based user interface 116-1 for collecting maintenance data of each power device 130 and the health prediction index thresholds, and is further configured for storing all of the collected data, the health prediction index thresholds, and all of the obtained lifetime data to the database 114.

Figure 3:
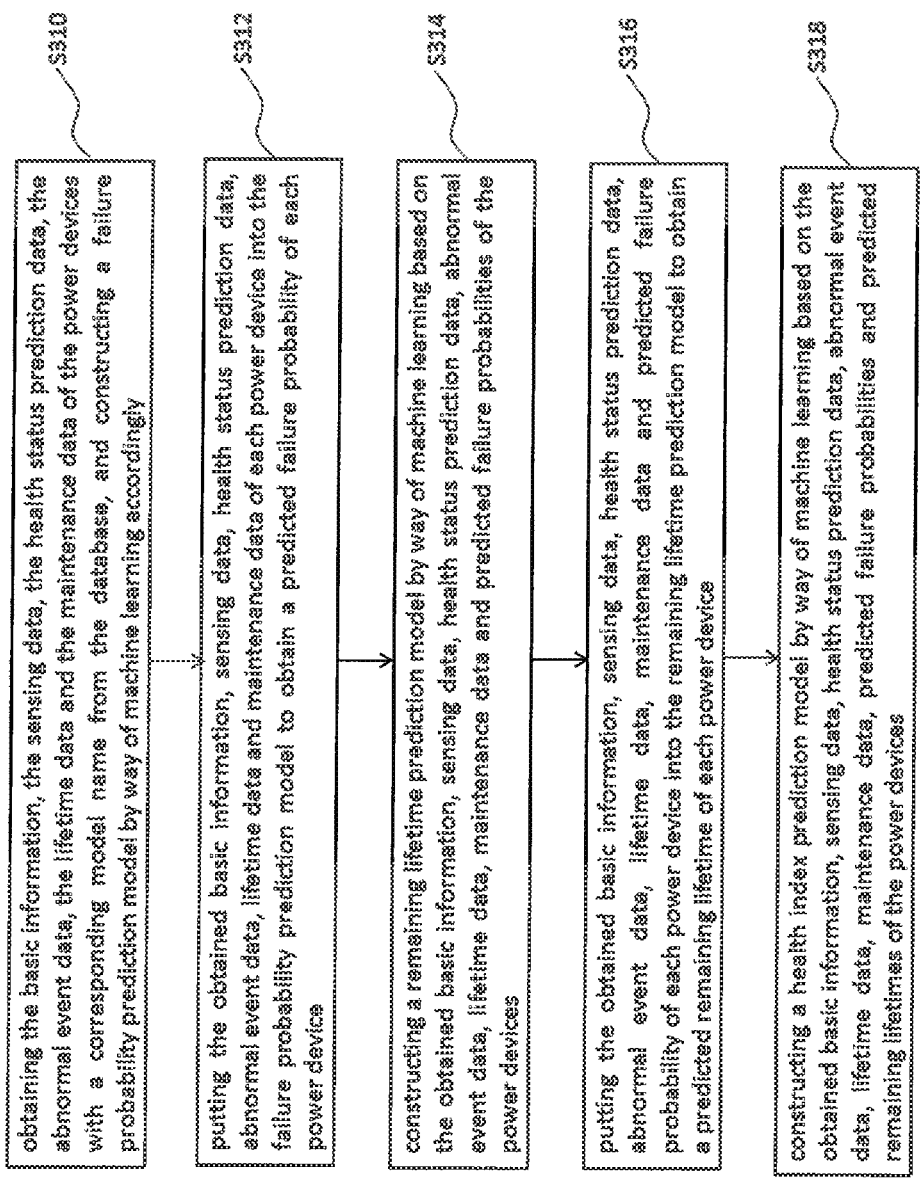
FIG. 3 shows the construction process of each health index prediction model.

After that, the way of constricting each health index prediction model will be described. FIG. 3 shows the construction process of each health index prediction model. Please refer to FIG. 3 and FIG. 1. Before starting to construct a health index prediction model, the database 114 needs to pre-store basic information, sensing data, health status prediction data, abnormal event data, lifetime data and maintenance data of at least part of the power device 130 corresponding to at least one model name. Further, the pre-stored data must reach a certain amount. In addition, some of the pre-stored data can be given by the user, such as health status prediction data. The cloud server 110 constructs required health index prediction models based on the existing data pre-stored in the database 114.

When starting to construct a health index prediction model, the prediction-model training module 112 obtains the basic information, the sensing data, the health status prediction data, the abnormal event data, the lifetime data and the maintenance data of the power devices 130 with a corresponding model name from the database 114, and constructs a failure probability prediction model by way of machine learning accordingly (as shown in step S310). Next, the prediction-model training module 112 puts the obtained basic information, sensing data, health status prediction data, abnormal event data, lifetime data and maintenance data of each power device 130 into the failure probability prediction model to obtain a predicted failure probability of each power device 130 (as shown in step S312).

After that, the prediction-model training module 112 constructs a remaining lifetime prediction model by way of machine learning based on the obtained basic information, sensing data, health status prediction data, abnormal event data, lifetime data, maintenance data and predicted failure probabilities of the power devices 130 (as shown in step S314). Next, the prediction-model training module 112 puts the obtained basic information, sensing data, health status prediction data, abnormal event data, lifetime data, maintenance data and predicted failure probability of each power device 130 into the remaining lifetime prediction model to obtain a predicted remaining liftime of each power device 130 (as shown in step S316). Then, the prediction-model training module 112 constructs a health index prediction model by way of machine learning based on the obtained basic information, sensing data, health status prediction data, abnormal event data, lifetime data, maintenance data, predicted failure probabilities and predicted remaining lifetimes of the power devices 130 (as shown in step S318).

Next, the way of training each health index prediction model will be described. After the required health index prediction models are constructed, the cloud server 110 transmits the constructed health index prediction models to the corresponding power devices 130 through the communication module 120, so that the power devices 130 generate new health status prediction data accordingly. Then, the cloud server 110 collects the basic information, the sensing data, the health status prediction data, the abnormal event data and the maintenance data of the power devices 130 corresponding to the health index prediction models through the data collection module 116, obtains lifetime data of each aforementioned power device 130 based on corresponding basic information, and stores the newly collected data and the newly obtained lifetime data to the database 114, Thus, the updated database 114 stores the pre-stored data, the newly collected data, and the newly obtained lifetime data. The cloud server 110 trains the aforementioned health index prediction models based on the pre-stored data and the newly stored data in the database 114.

Figure 4:
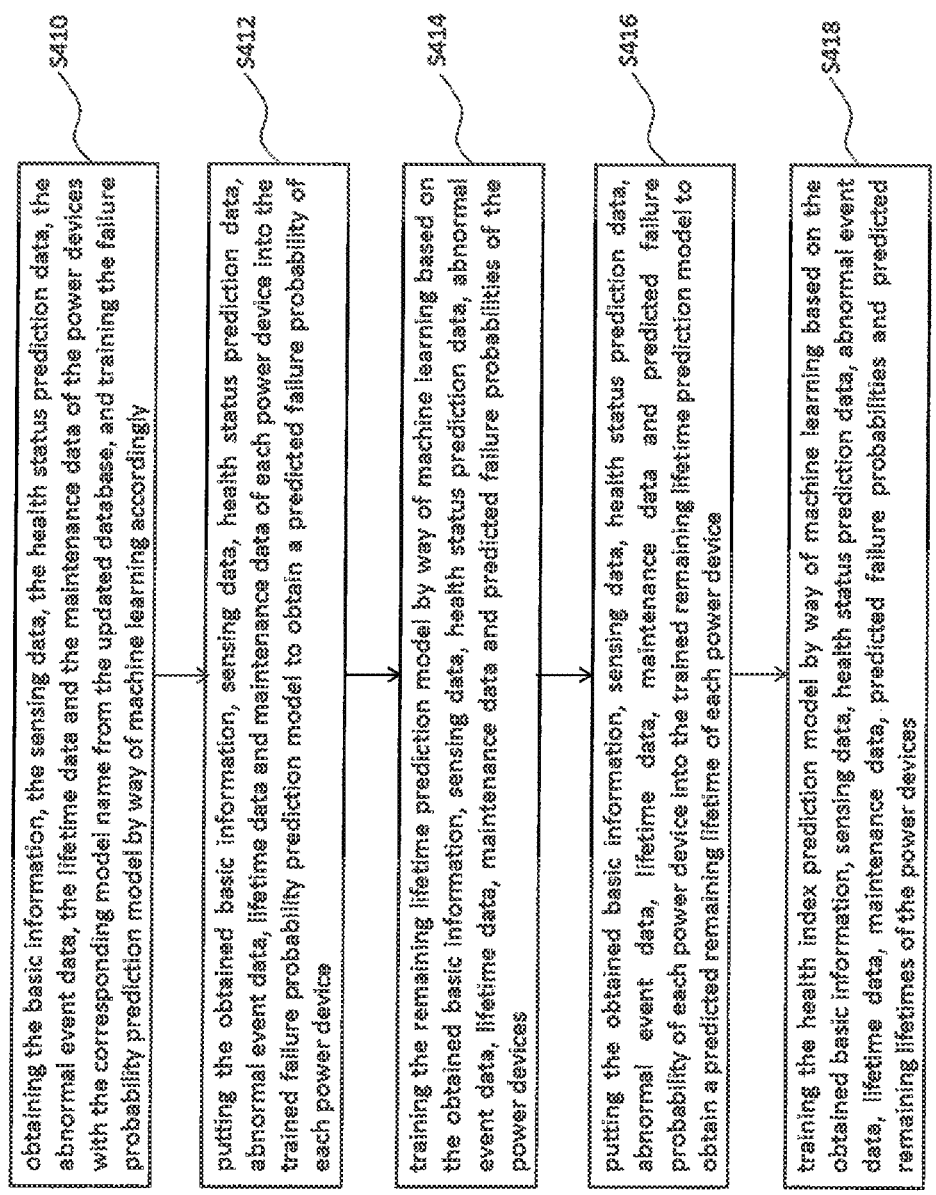
FIG. 4 shows the training process of each health index prediction model.

FIG. 4 shows the training process of each health index prediction model. Please refer to FIG. 4 and FIG. 1. When starting to train one of the health index prediction models, the prediction-model training module 112 obtains the basic information, the sensing data, the health status prediction data, the abnormal event data, the lifetime data and the maintenance data of the power devices 130 with the corresponding model name from the updated database 114, and trains the corresponding failure probability prediction model by way of machine learning accordingly (as shown in step S410). Next, the prediction-model training module 112 puts the obtained basic information, sensing data, health status prediction data, abnormal event data, lifetime data and maintenance data of each power device 130 into the trained failure probability prediction model to obtain a predicted failure probability of each power device 130 (as shown in step S412).

After that, the prediction-model training module 112 trains the corresponding remaining lifetime prediction model by way of machine learning based on the obtained basic information, sensing data, health status prediction data, abnormal event data, lifetime data, maintenance data and predicted failure probabilities of the power devices 130 (as shown in step S414). Next, the prediction-model training module 112 puts the obtained basic information, sensing data, health status prediction data, abnormal event data, lifetime data, maintenance data and predicted failure probability of each power device 130 into the trained remaining lifetime prediction model to obtain a predicted remaining lifetime of each power device 130 (as shown in step S416). Then, the prediction-model training module 112 trains the corresponding health index prediction model by way of machine learning based on the obtained basic information, sensing data, health status prediction data, abnormal event data, lifetime data, maintenance data, predicted failure probabilities and predicted remaining lifetimes of the power devices 130 (as shown in step S418).

After training the required health index prediction models, the cloud server 110 transmits the trained health index prediction models to the corresponding power devices 130 through the communication module 120 for use by the power devices 130. Certainly, the aforementioned training process may be performed again in a regular manner or an irregular manner, so as to retain the health index prediction models. As the number of training increases, the accuracy of the health status prediction data also increases correspondingly.

Referring to FIG. 1 again, in this embodiment, when the data collection module 116 determines that there is newly obtained health status prediction data indicates that a corresponding power device 130 is in poor health condition, the data collection module 116 pushes an alarm message to a smart handheld device of a corresponding user by the alarm message push module 118. The smart handheld device can be, for example, a mobile phone, a notebook computer, or a tablet computer. In addition, in this embodiment the data collection module 116 further receives, through the web-based user interface 116-1, an alarm action and at least one determination condition which are set by a user, generates an alarm execution script accordingly, and transmits the alarm execution script to at least one corresponding power device 130 through the communication module 120.

Although in the foregoing embodiments the cloud server 110 comprises the alarm message push module 118 and each power device 130 comprises the alarm module 140, this is not intended to limit the present invention. Those skilled in the art should know whether to adopt the alarm message push module 118 and the alarm module 140 can be determined according to actual design requirements. In addition, although in the foregoing embodiments all the power devices 130 are uninterruptible power systems as an example, this is not intended to limit the present invention. Those skilled in the art should know that the power devices 130 can be power distribution units or auto transfer switches, or even consists of at least two of the three types of power devices described above. Certainly, when there are power devices 130 implemented by power distribution units or auto transfer switches, the contents of their basic information, sensing data, health status prediction data, abnormal event data, lifetime data, maintenance data, and corresponding health prediction index thresholds need to be adjusted accordingly, and the factors considered in the corresponding health index prediction models, failure probability prediction models, and remaining lifetime prediction models also need to be adjusted accordingly.

Figure 5:
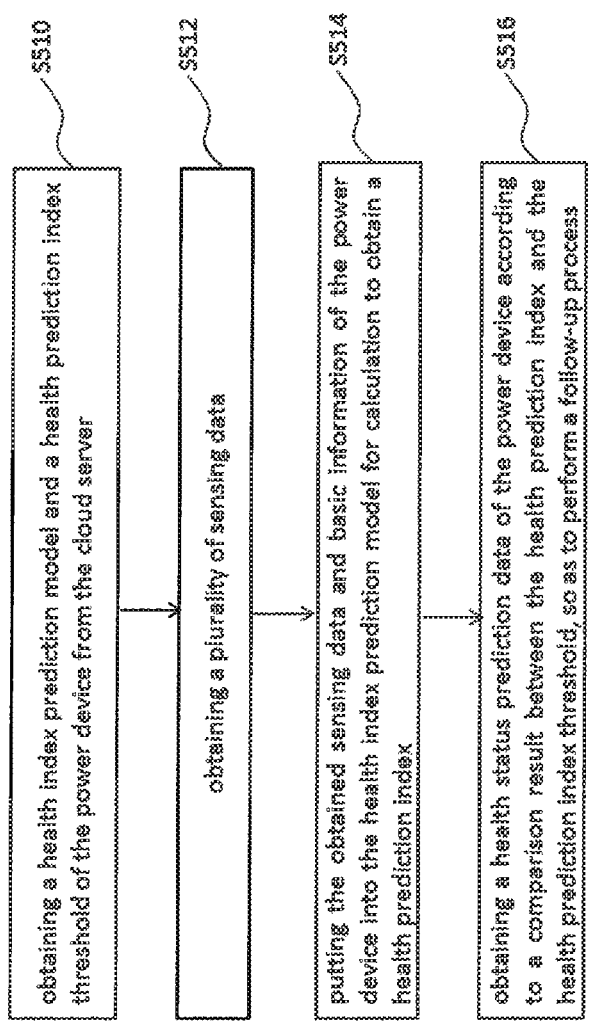
FIG. 5 is a flowchart of the self-health status prediction method of a power device according to an embodiment of the present invention.

In addition, from the above descriptions, those skilled in the art should be able to summarize some basic steps of the self-health status prediction method of the power device of the present invention, as shown in FIG. 5. FIG. 5 is a flowchart of the self-health status prediction method of a power device according to an embodiment of the present invention. The said power device comprises a plurality of sensors and a communication module. The method comprises the following steps. First, a health index prediction model and a health prediction index threshold of the power device are obtained from a cloud server through a communication module (as shown in step S510), wherein the health index prediction model is constructed and trained by the cloud server by way of machine learning. Next, a plurality of sensing data is obtained by the sensors (as shown in step S512). Then, the sensing data and the basic information of the power device are put into the health index prediction model for calculation to obtain a health prediction index (as shown in step S514). After that, a health status prediction data of the power device is obtained according to a comparison result between the health prediction index and the health prediction index threshold, so as to perform a follow-up process (as shown in step S516). Certainly, the execution order of steps S510 and S512 can be reversed.

In summary, since the power device of the present invention can perform the self-health status prediction function, and perform corresponding follow-up process when the health status prediction data indicates that the power device is in poor health condition, the maintenance personnel can take preventive measures first when the power device is in poor health condition. Furthermore, since the cloud server of the present invention can retrain the health index prediction models required by the power devices again and again, the accuracy of health status prediction data will continue to increase correspondingly.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cloud server suitable for a plurality of power devices, the cloud server comprising:
   a communication module;
   a database, configured for storing basic information, sensing data, health status prediction data, abnormal event data, lifetime data and maintenance data of each power device, and for storing a health prediction index threshold corresponding to a model name of each power device;
   a prediction-model training module, configured for constructing and training a health index prediction model for each model name, wherein each health index prediction model is constructed and trained, by way of machine learning, based on the basic information, the sensing data, the health status prediction data, the abnormal event data, the lifetime data and the maintenance data of the power devices with a corresponding model name in the database; and
   a data collection module, configured for collecting basic information, sensing data, health status prediction data, and abnormal event data of each power device through the communication module, obtaining lifetime data of each power device based on corresponding basic information, providing a web-based user interface for collecting maintenance data of each power device and the health prediction index thresholds, and storing all of the collected data, the health prediction index thresholds, and all of the obtained lifetime data to the database,
   wherein the steps performed by the prediction-model training module in constructing each health index prediction model comprise:
   obtaining the basic information, the sensing data, the health status prediction data, the abnormal event data, the lifetime data and the maintenance data of the power devices with a corresponding model name from the database, and constructing a failure probability prediction model by way of machine learning accordingly;

putting the obtained basic information, sensing data, health status prediction data, abnormal event data, lifetime data and maintenance data of each power device into the failure probability prediction model to obtain a predicted failure probability of each power device;

constructing a remaining lifetime prediction model by way of machine learning based on the obtained basic information, sensing data, health status prediction data, abnormal event data, lifetime data, maintenance data and predicted failure probabilities of the power devices;

putting the obtained basic information, sensing data, health status prediction data, abnormal event data, lifetime data, maintenance data and predicted failure probability of each power device into the remaining lifetime prediction model to obtain a predicted remaining lifetime of each power device; and constructing a health index prediction model by way of machine learning based on the obtained basic information, sensing data, health status prediction data, abnormal event data, lifetime data, maintenance data, predicted failure probabilities and predicted remaining lifetimes of the power devices.

2. The cloud server as claimed in claim 1, wherein the prediction-model training module trains each health index prediction model after the health index prediction models are constructed, and the steps performed by the prediction-model training module in training each health index prediction model comprise:

obtaining the basic information, the sensing data, the health status prediction data, the abnormal event data, the lifetime data and the maintenance data of the power devices with the corresponding model name from the updated database, and training the failure probability prediction model by way of machine learning accordingly;

putting the obtained basic information, sensing data, health status prediction data, abnormal event data, lifetime data and maintenance data of each power device into the trained failure probability prediction model to obtain a predicted failure probability of each power device;

training the remaining lifetime prediction model by way of machine learning based on the obtained basic information, sensing data, health status prediction data, abnormal event data, lifetime data, maintenance data and predicted failure probabilities of the power devices;

putting the obtained basic information, sensing data, health status prediction data, abnormal event data, lifetime data, maintenance data and predicted failure probability of each power device into the trained remaining lifetime prediction model to obtain a predicted remaining lifetime of each power device; and training the health index prediction model by way of machine learning based on the obtained basic information, sensing data, health status prediction data, abnormal event data, lifetime data, maintenance data, predicted failure probabilities and predicted remaining lifetimes of the power devices.

3. The cloud server as claimed in claim 1, wherein the basic information of each power device comprises at least one of a model name, a manufacturing date, a rated power, a rated voltage and a rated current.

4. The cloud server as claimed in claim 1, wherein the sensing data of each power device comprises at least one of input voltages, input currents, output voltages, output currents, battery voltages, battery charging currents, battery discharge currents, ambient temperatures and ambient humidities.

5. The cloud server as claimed in claim 1, further comprising an alarm message push module, wherein when the data collection module determines that there is health status prediction data indicates that a corresponding power device is in poor health condition, the data collection module pushes an alarm message to a smart handheld device of a corresponding user by the alarm message push module.

6. The cloud server as claimed in claim 1, wherein the data collection module further receives, through the web-based user interface, an alarm action and at least one determination condition which are set by a user, generates an alarm execution script accordingly, and transmits the alarm execution script to at least one corresponding power device through the communication module.

7. The cloud server as claimed in claim 1, wherein the machine learning algorithms used by the cloud server comprise at least one of Artificial neural network algorithm, Decision tree algorithm, K-means algorithm, Support vector machine algorithm, Linear regression algorithm, and Logistic regression algorithm.

8. The cloud server as claimed in claim 1, wherein the power devices comprise uninterruptible power systems, power distribution units, or auto transfer switches.

* * * * *